United States Patent
Hedler et al.

(10) Patent No.: US 6,744,127 B2
(45) Date of Patent: Jun. 1, 2004

(54) SEMICONDUCTOR CHIP, MEMORY MODULE AND METHOD FOR TESTING THE SEMICONDUCTOR CHIP

(75) Inventors: Harry Hedler, Germering (DE); Jochen Müller, München (DE); Barbara Vasquez, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/159,848

(22) Filed: May 31, 2002

(65) Prior Publication Data

US 2003/0001236 A1 Jan. 2, 2003

(30) Foreign Application Priority Data

May 31, 2001 (DE) .......................... 101 26 610

(51) Int. Cl.[7] .............................................. H01L 23/02
(52) U.S. Cl. ..................................... 257/686; 257/777
(58) Field of Search ................................ 257/686, 777, 257/778

(56) References Cited

U.S. PATENT DOCUMENTS

| | | | | |
|---|---|---|---|---|
| 5,229,647 A | * | 7/1993 | Gnadinger | 257/785 |
| 5,783,870 A | * | 7/1998 | Mostafazadeh et al. | 257/791 |
| 5,928,343 A | | 7/1999 | Farmwald et al. | 710/104 |
| 5,973,396 A | * | 10/1999 | Farnworth | 257/698 |
| 6,122,187 A | * | 9/2000 | Ahn et al. | 365/63 |
| 6,236,115 B1 | | 5/2001 | Gaynes et al. | 257/774 |
| 6,239,495 B1 | * | 5/2001 | Sakui et al. | 257/777 |
| 6,577,013 B1 | * | 6/2003 | Glenn et al. | 257/777 |

* cited by examiner

Primary Examiner—Phat X. Cao
(74) Attorney, Agent, or Firm—Laurence A. Greenberg; Werner H. Stemer; Gregory L. Mayback

(57) ABSTRACT

A lowermost layer of control chips carries on it layers of memory chips. The memory chips are contacted via looped-through contacts that reach from one side of the other side of the memory chips and they are driven by the control chips that contain the test circuit for the memory chips.

3 Claims, 1 Drawing Sheet

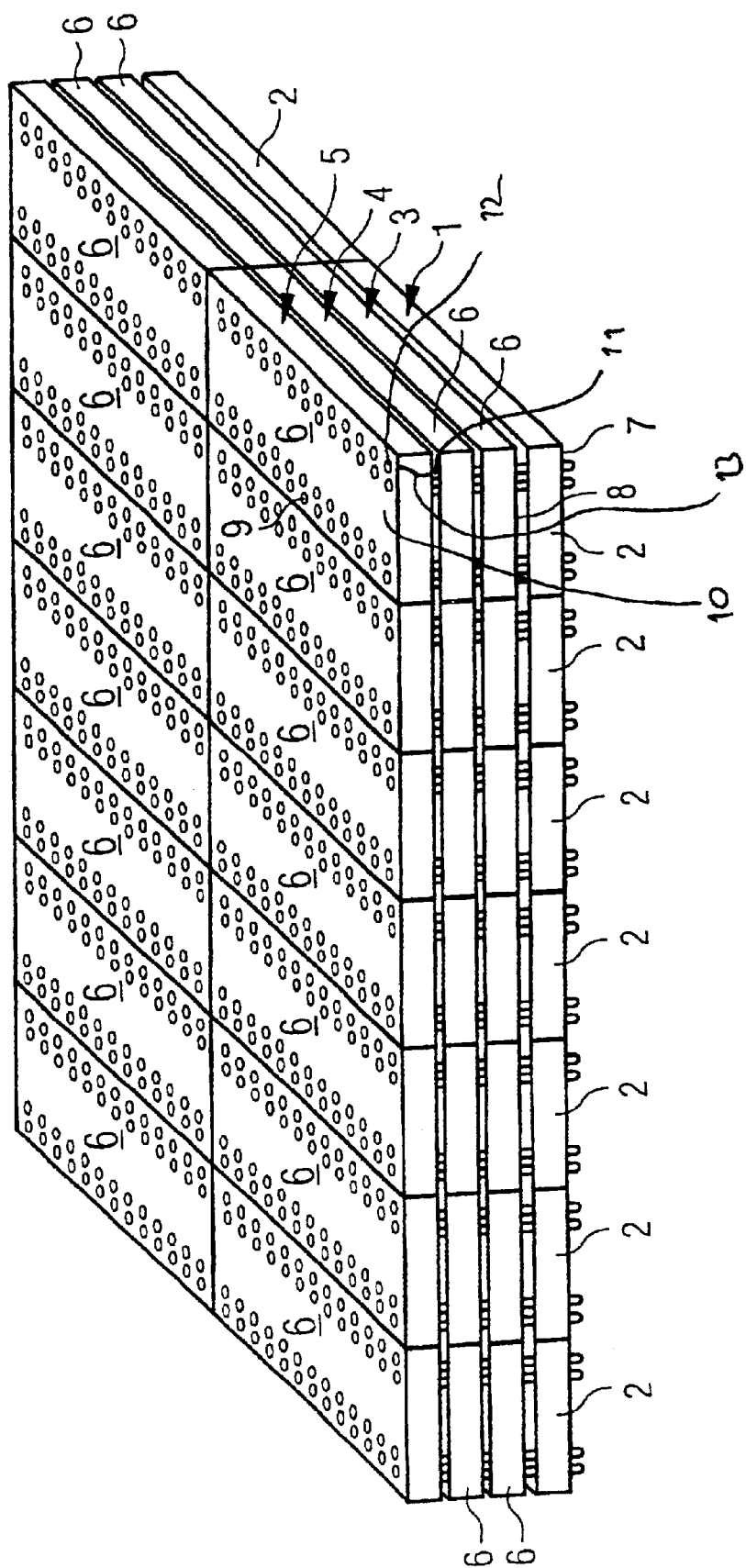

SEMICONDUCTOR CHIP, MEMORY MODULE AND METHOD FOR TESTING THE SEMICONDUCTOR CHIP

BACKGROUND OF THE INVENTION

FIELD OF THE INVENTION

The invention lies in the semiconductor technology field. More specifically, the invention relates to a semiconductor chip, a memory module and a method for testing the semiconductor chip.

In order to ensure the correct functioning of semiconductor chips, semiconductor chips are usually tested prior to delivery. In principle, there are two different procedures for this.

By way of example, it is possible to connect an external test device to the semiconductor chips and to check the semiconductor chips with the aid of this test device. A disadvantage here is that the semiconductor chips each have to be individually contact-connected, which is complicated given the large number of semiconductor chips on a wafer.

Furthermore, it is possible to integrate the test circuit into the semiconductor chip and to drive it externally via an interface. This method is known under the designation BIST ("Build In Self Test") in the semiconductor industry. In some cases, the test circuit also provides for a self-repair of the semiconductor chips. This method is also known as BISR ("Build In Self Repair"). One disadvantage of the integrated test circuits is that they take up a considerable proportion of the area of the semiconductor chip. This leads to an unacceptable increase in the costs for fabricating the semiconductor chips.

SUMMARY OF THE INVENTION

It is accordingly an object of the invention to provide a semiconductor chip, a memory module and a method for testing the semiconductor chip, which overcomes the above-mentioned disadvantages of the heretofore-known devices and methods of this general type and which provides for a semiconductor chip and, in particular, a memory module which can be tested in a simple manner. It is a further object to provide for a simple test method.

With the foregoing and other objects in view there is provided, in accordance with the invention, a semiconductor chip, comprising:
a chip body having a first side and an opposite second side;
a multiplicity of external contacts including at least one contact on the first side of the chip body, at least one contact on the second side of the chip body, and a connection connecting the contacts and extending through the chip body.

By virtue of the looping-through of contacts of the semiconductor chip, these can be stacked on a control chip and be tested jointly with the aid of the control chip. This method is particularly advantageous if a large number of identical semiconductor chips are to be tested. This is the case with memory chips, in particular. It is also conceivable, in principle, to stack a large number of memory chips on top of one another in order thereby to increase the storage volume per memory module.

In the semiconductor chips, the data and address lines are looped through from one side of the semiconductor chip to the other side of the semiconductor chip.

The looping-through of the data and address lines affords the advantage that the semiconductor chips can be individually addressed via the data and address lines as in the case of a conventional memory module.

In accordance with an added feature of the invention, the semiconductor chip is a memory chip and the external contacts are contacts for data lines and address lines looped through from one side of the memory chip to an opposite side of the memory chip.

In accordance with an additional feature of the invention, the contact is a looped-through contact for serial data communication.

With the above and other objects in view there is also provided, in accordance with the invention, a memory module, comprising a control chip and a multiplicity of memory chips forming memory units stacked on the control chip, and at least one contact looped through from one side of a respective the memory chip to an opposite side of the memory chip.

In accordance with another feature of the invention, the memory chips have a multiplicity of looped-through contacts connected to the internal data lines, address lines, or command lines of the memory chip.

In accordance with a further feature of the invention, the looped-through contact is a line for serial data communication.

In accordance with again an added feature of the invention, the control chip is formed with a given minimum feature size that is larger than a minimum feature size of the memory chip stacked on the control chip.

In accordance with again an additional feature of the invention, the memory chips are contained in a wafer composite stacked onto a wafer with the control chips.

In accordance with again another feature of the invention, the control chip is configured to control a performance of a functional test of the memory chip.

With the above and other objects in view there is also provided, in accordance with the invention, a method of testing semiconductor chips, which comprises stacking the semiconductor chips on a control chip configured for testing a function of the semiconductor chips and forming contact between the control chip and the semiconductor chips with a contact looped through from one side of the semiconductor chips to another side of the semiconductor chips; and testing the function of the semiconductor chips.

In accordance with again another feature of the invention, a wafer composite of a multiplicity of semiconductor chips arranged next to one another is stacked on top of a wafer composite of control chips arranged next to one another.

In accordance with again a further feature of the invention, test signals supplied by the semiconductor chips are transmitted to the control chip via looped-through data, address or command lines. Also, the test signals may be transmitted via a serial line.

In accordance with a concomitant feature of the invention, control signals for initiating and performing a functional test of the semiconductor chip are generated with the control chip and the control signals are transferred to one of the semiconductor chips via the looped-through contact.

Other features which are considered as characteristic for the invention are set forth in the appended claims.

Although the invention is illustrated and described herein as embodied in a semiconductor chip, memory module and method for testing the semiconductor chip, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The sole FIGURE of the drawing shows a perspective view of a plurality of memory chips stacked on control chips.

DESCRIPTION OF THE PREFERRED EMBODIMENTS

Referring now to the FIGURE of the drawing in detail, a series of control chips 2 are disposed next to one another to form a bottommost layer 1. The drawing is intended to indicate that the control chips 2 are still situated in the wafer composite. Disposed above the control chips 2 are a second layer 3, a third layer 4, and a fourth layer 5 of memory chips 6 which are likewise still situated in the wafer composite.

In order to test the memory chips 6, the respectively assigned control chip 2 transmits test signals to the overlying memory chips 6. In order that the test signals reach the memory chips in the layers 3 to 5, contacts 7 on an underside 8 are in each case looped through to contact points 9 on a top side 10 of the respective memory chips 6 in the layers 3 to 5. Methods for fabricating such looped-through contacts are known to the person skilled in the art and are not the subject matter of the application. This means that signal lines running on the top side of the semiconductor chip are led through a hole running through the semiconductor body and are led to the other, opposite side of the semiconductor chip. Contact areas 12 arranged on the top side of one of the chips are connected via the looped-through contacts 13 to the contact areas 11 arranged on the underside of the chip. The contacts are each externally accessible from the surface and can be contact-connected for feeding in and tapping off signals.

The contacts 7 looped through to the contact points 9 of each memory chip 6 are connected to the internal data, address and command lines in the memory chips 6. As a result, the control chip 2 can address memory cells in the memory chips 6 via the customary data, address, and command lines.

It is also possible that only a selection among the data, address and command lines is required for carrying out the test method. In this case, it suffices to loop through the required selection on data, address, and command lines.

The configuration illustrated in the figure is distinguished by the separation of memory chips 6 and the test circuit integrated into the control chips 2. As a result, no chip area is lost in the expensive memory chips 6.

Furthermore, the control chip 2 can be processed with a technology from a preceding technology generation and have a larger minimum feature size than that minimum feature size of the memory chips. The smallest feature size is, for example, the length of the gate of a MOS field-effect transistor. In general, the circuitry outlay for the control chip 2 is significantly smaller than that for the memory chip 6 to be tested. Therefore, despite the larger feature size, the occupied chip area of the control chip 2 can be smaller than the occupied chip area in the memory chip 6. This is also advantageous insofar as the processes of the preceding technology generation have reached a significantly higher degree of maturity and are therefore less susceptible to faults than the present technology generation used. It can therefore be assumed that the control chips 2 can be produced virtually without any defects.

In the configuration illustrated in the figure, the components required for performing BIST (Build in Self Test) and BISR (Build in Self Repair) are no longer situated in each of the memory chips 6, but are shifted to the lowermost layer 1 of the chip stack into the control chip 2. As a result, a division of work takes place between the lowermost layer 1 and the layers 3 to 5. The control signals that initiate and control a test method according to BIST or BISR are generated by the control chip 2. The control signals are transferred from the control chip to the semiconductor chips of the chip stack that are arranged above said control chip, in order to test said semiconductor chips for correct functioning and, if appropriate, to repair them. By way of example, test results are transferred from the semiconductor chips to the control chips, where decisions about functionality and repair steps are determined.

The exemplary embodiment described here is suitable in particular for identical semiconductor chips such as the memory chips 6 illustrated in the FIGURE. However, it is also conceivable for a series of semiconductor chips with identical external dimensions to be stacked on top of one another, which are each connected via a contact looped through from an underside to a top side. The communication with the individual memory chips 6 can take place through these separate command lines. The data communication on the command lines preferably takes place in a serial manner.

Furthermore, it shall be noted that the memory chips 6 illustrated in the FIGURE can each be combined to form a memory module and be arranged in a housing. The memory modules with a control chip 2 on which the memory chips 6 are stacked have a significantly larger storage capacity compared with conventional memory modules each having a memory chip 6 inside the housing.

Accordingly, the memory modules produced in this way can also be used to produce memory modules having a high storage capacity that can be used in a computer.

Wafers containing a multiplicity of chips can also be stacked one above the other and be connected to one another in this way. The wafers of the upper layers 3, 4, 5 contain semiconductor memory modules which are still contained in the wafer composite. The wafer of the bottom layer 2 contains the control chips for initiating and performing the test of the respective overlying memory module in the overlying wafer. The wafers of the planes 3, 4, 5 are in each case embodied identically through the looped-through contacts and can equally be used in one of the planes 3, 4 or 5.

We claim:

1. A memory module, comprising:
   a control chip and a multiplicity of memory chips forming memory units stacked on said control chip;
   each of said memory chips having:
     a chip body with a first side and an opposite second side;
     field effect transistors having gate electrodes with a minimum feature size;
     a multiplicity of external contact including at least one contact on said first side of said chip body, at least one contact on said second side of said chip body, and a connection connecting said contacts and extending through said chip body;
     internal lines selected from the group consisting of data lines, address lines, and command lines, and a multiplicity of looped-through contacts connected to said internal lines coupled to said control chip;
   said control chip including field effect transistors having a gate with a given minimum feature size larger than said minimum feature size of said gate electrodes of said field effect transistors of said memory chips;
   said control chip being configured to control a performance of a functional test of said memory chips.

2. The memory module according to claim 1, wherein at least one of said looped-through contacts is a line for serial data communication.

3. The memory module according to claim 1, wherein said memory chips are contained in a wafer composite stacked onto a wafer with said control chip.

* * * * *